United States Patent [19]

Hart et al.

[11] Patent Number: 4,750,214

[45] Date of Patent: Jun. 7, 1988

[54] DIGITAL FM DEMODULATOR USING DELAYED SIGNAL PRODUCT WITH ARCTANGENT

[75] Inventors: Billy D. Hart, Cedar Rapids; Maurice W. Peterson, Jr., Marion, both of Iowa

[73] Assignee: Rockwell International Corporation, El Segundo, Calif.

[21] Appl. No.: 873,242

[22] Filed: Jun. 11, 1986

[51] Int. Cl.⁴ .............................................. H04B 1/16
[52] U.S. Cl. ...................................... 455/214; 375/80
[58] Field of Search .................... 455/214; 375/77, 78, 375/80; 329/50, 124

[56] References Cited

U.S. PATENT DOCUMENTS

| | | | |
|---|---|---|---|
| 4,090,145 | 5/1978 | Webb | 375/77 |
| 4,317,210 | 2/1982 | Dekker et al. | 375/80 |
| 4,481,646 | 11/1984 | Godard | 329/50 |
| 4,560,941 | 12/1985 | Welles, II. et al. | 455/214 |
| 4,583,048 | 4/1986 | Gumacos et al. | 329/50 |

FOREIGN PATENT DOCUMENTS 2113930 8/1983 United Kingdom ................ 329/144

*Primary Examiner*—Michael A. Masinick
*Attorney, Agent, or Firm*—M. Lee Murrah; V. Lawrence Sewell; H. Frederick Hamann

[57] ABSTRACT

FM signals are demodulated with lower distortion and expenditure of less computing time by digitizing the signals using an A/D converter of predetermined sample frequency and down-converting the signals to their base band quadrature components. The quadrature components are delayed by one sample period, and the complex cross-product of current quadrature components and the delayed quadrature components from the immediately preceding A/D sample period is taken. The arctangent of the resulting cross-product is taken by calculating the ratio of the imaginary and real components thereof to produce a value which is representative of the original modulating signal.

15 Claims, 1 Drawing Sheet

DIGITAL FM DEMODULATOR USING DELAYED SIGNAL PRODUCT WITH ARCTANGENT

BACKGROUND OF THE INVENTION

Field of the Invention

The invention relates to frequency modulation discriminators, and more particularly to frequency modulation discriminators using digital signal processing techniques.

Frequency modulation (FM) is a commonly used technique for imposing an information-carrying signal onto a carrier signal for transmission to a remote location. When the signal is received at the remote location, it is necessary to extract, or demodulate, the original information signal from the carrier signal using a frequency discriminator.

A common technique form of discriminator uses the quadrature components of the modulated signal to derive the original information signal. Examples of this are found in U.S. Pat. Nos. 3,500,217 to Allen, 4,583,048 to Gumacos et al., and 3,568,067 to Wiliford.

In the past as the aforementioned patents indicate, it was common to perform the demodulation using entirely analog techniques. In recent years, however, the rise in the use of computers and digital electronics has led to the desire to perform demodulation using digital signal processing techniques.

The primary object of the present invention is to provide an FM demodulator which will operate efficiently on digitally-sampled signals.

Other objects of the invention are to provide an FM demodulator which does not need to be adjusted and which provides a high level of computational precision.

SUMMARY OF THE INVENTION

With these and other objects in view, the present invention converts an FM signal to digital form at a predetermined sampling rate and derives the quadrature components I and Q of the signal. Both I and Q are delayed by one analog-to-digital conversion sample time, and the complex cross product of I and Q and their delayed values is calculated. The arctangent of the resulting value is taken by calculating the ratio of the real and imaginary components of such value. The result is a value representing the angle change between the two successive samples of the FM signal and thus relating to the amplitude of the original modulating signal.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
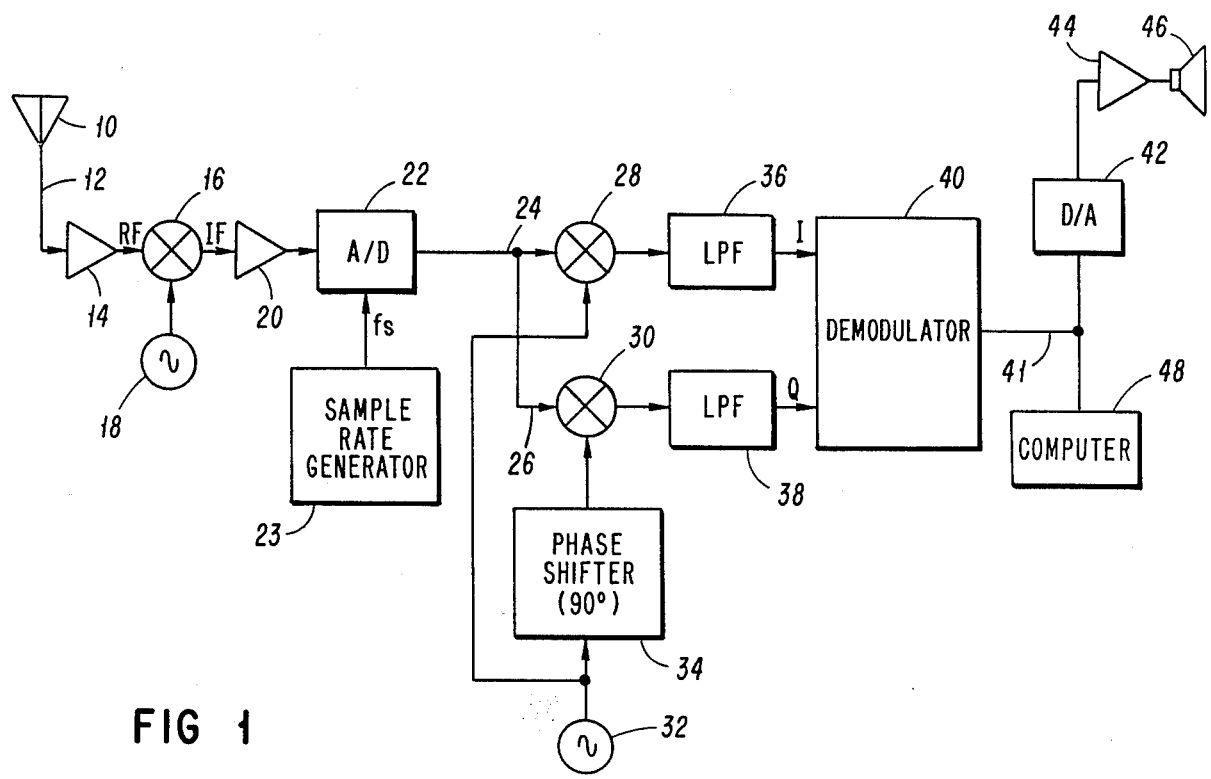
FIG. 1 is a somewhat schematic representation of a radio receiver circuit employing the FM demodulator of the present invention.

Referring first to the overall radio receiver circuit of FIG. 1, an antenna 10 is connected via a transmission line 12 to the input of a radio frequency (RF) amplifier 14, which amplifies the received signals to a usable level. Amplifier 14 is connected to one input of a mixer 16, whose other input is connected to local oscillator 18.

The output of local oscillator 18 is connected to the input of an intermediate frequency (IF) amplifier 20, whose output is in turn connected to the input of an analog-to-digital (A/D) converter 22. Also connected to an input of A/D converter 22 is a sample rate generator 23, which periodically sends a sampling signal to A/D converter at a frequency, or processing rate, of $f_s$, which is independent of the RF or IF frequency.

The output of A/D converter 22 is split into branches 24 and 26, and branch 24 is connected to one input of a digital mixer 28, and branch 26 is connected to one input of another digital mixer 30. The second input of digital mixer 28 is connected to a direct digital synthesizer 32 which directly produces the amplitude values of a sine wave and thus serves as the digital equivalent of an analog local oscillator. The second input of digital mixer 30 is connected to the output of a digital phase shifter 34 which provides a hase shift of 90°. The input of digital phase shifter 34 is connected to direct digital synthesizer 32.

The output of digital mixer 28 is connected to the input of a digital low pass filter (LPF) 36 whose output is quadrature component I and is connected to one input of a demodulator 40. Likewise, the output of digital mixer 30 is connected to the input of a digital low pass filter (LPF) 38, whose output is quadrature component Q and is connected to the other input of demodulator 40.

For voice or other analog signals, the output of demodulator 40 may be connected to the input of a digital-to-analog (D/A) converter 42, whose output is in turn connected to an audio amplifier whose output 44 may be connected to a loudspeaker 46. For digital data, on the other hand, the output of demodulator 40 may be connected to a digital computer 48, or other digital processing circuitry.

Figure 2:
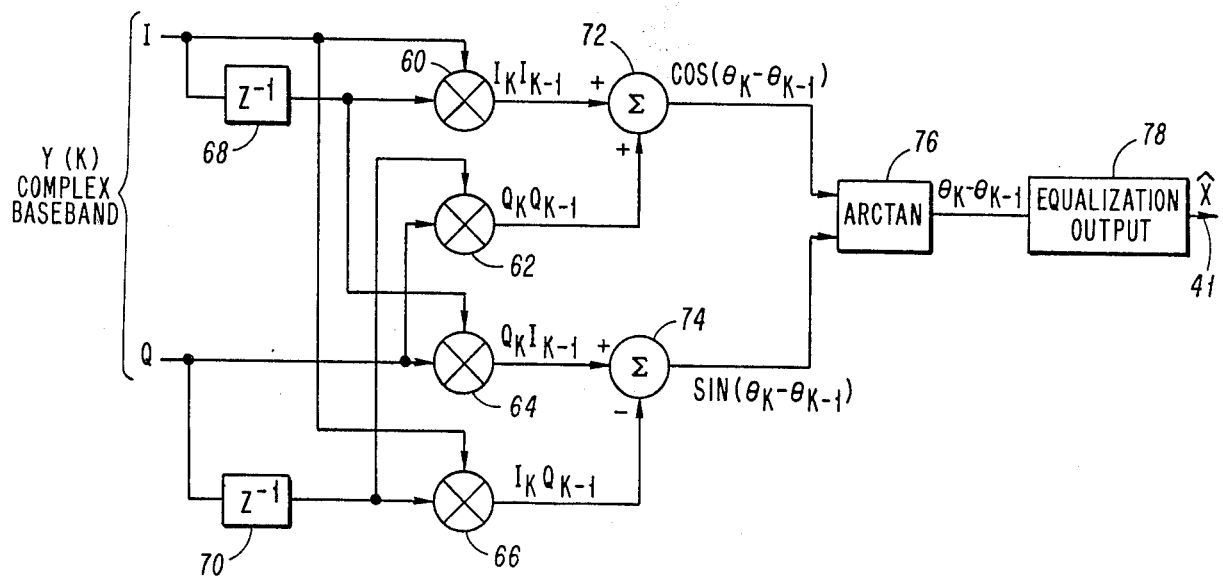
FIG. 2 is also a somewhat schematic and more detailed representation of the FM demodulator shown in FIG. 1 and associated circuitry.

Referring next to the more detailed representation of demodulator 40 as shown in FIG. 2, the quadrature component I connected to the inputs of a digital multiplier 60, a digital multiplier 66, and a delay network 68. Delay network 68 provides a time delay of one cycle of sample rate generator 23. The output of delay network 68 is connected both to the input of digital multiplier 60 and to the input of a digital multiplier 64.

The quadrature component Q is connected to the inputs of a digital multiplier 62, digital multiplier 64, and a delay network 70, the latter of which operates similarly to delay network 68 but on the quadrature component Q. The output of delay network 70 is connected to the inputs of both digital multiplier 62 and digital multiplier 66.

The outputs of digital multipliers 60 and 62 are both connected to the inputs of digital summer 72. Similarly, the outputs of digital multipliers 64 and 66 are connected to the inputs of digital summer 74. The outputs of summers 72 and 74 are then connected to the inputs of an arctangent network 76. The output of arctangent network 76 is connected to an equalization output network 78, whose output X is on line 41 as shown in FIG. 1.

It should be understood that while FIG. 2 has been described in terms of individual digital components, the circuit could be realized using software in a general purpose digital computer.

In the operation of the invention, an information-carrying electromagnetic signal (FIG. 1) is received by antenna 10, and it is amplified by RF amplifier 14. The amplified RF signal is mixed in mixer 16 with a sine wave of appropriate frequency produced by local oscillator 18. The resultant intermediate frequency (IF) signal is amplified by IF amplifier 20 and then converted from analog form to a time series of binary values by A/D converter 22 at a sample frequency of $f_s$.

The digitized IF signal is fed to both digital mixers 28 and 30. In mixer 28 the digitized IF signal is mixed with the synthesized sine wave values produced by direct digital synthesizer 32. The frequency of the sine wave values produced by synthesizer 32 is chosen to be in the middle of the IF frequency band to down convert the IF signal to the DC level to produce a base band signal. The result is passed through low pass filter 36 to remove the frequency sum products of the mixing process and to retain the frequency difference product, in-phase component I, of the original IF signal fed into mixer 28. In mixer 30 the IF signal is mixed with the synthesized sine wave produced by direct digital synthesizer 32 but which has been shifted in phase by 90 degrees by phase shifter 34. The output from mixer 30 is passed through low pass filter 38 to remove the frequency sum products of the mixing process and to retain the frequency difference product, quadrature component Q, which is the "imaginary" base band portion of the original IF signal fed into mixer 28.

Quadrature components I and Q are combined in FM demodulator 40, the operation of which will be hereinafter described in more detail; and a demodulated signal representative of the phase angle change between the most recent samples of A/D converter 22 is produced at the output 41. If the demodulated signal represents voice or other analog information, then it is converted to analog form by D/A converter 42, amplified by audio amplifier 44, and presented to loudspeaker 46 for audio reproduction. On the other hand, if the demodulated signal at 41 represents digital information, then it may be sent to computer 48 for further processing.

Demodulator 40 produces a cross-product of quadrature components I and Q developed by A/D converter 22 during the most recent sampling and the I and Q quadrature components for the immediately preceding A/D sampling, in multipliers 60, 62, 64, and 66. In particular, quadrature component I is fed to multiplier 60 and to delay network 68. The I component is delayed one sample time of sample rate generator 23 (FIG. 1) in delay network 68 and fed to both multipliers 60 and 64. In-phase component I is also fed to multiplier 66 where it is combined with other signals as hereinafter described.

Quadrature component Q is fed to multiplier 64 and to multiplier 62. Quadrature component Q is also fed to delay network 70 where it is delayed one sample time of sample rate generator 23. The delayed quadrature component Q is then fed to both multipliers 62 and 66.

Thus, the present sampled value of $II_k$ and its immediately preceding sampled value $I_{k-1}$ are fed to multiplier 60, the present sampled value of $QQ_k$ and its immediately preceding sampled value $Q_{k-1}$ are fed to multiplier 62, the immediately preceding sampled value of $II_{k-1}$ and the present sampled value of $QQ_k$ are fed to multiplier 64, and the present sampled value of $II_k$ and the previous sampled value of $QQ_{k-1}$ are fed to multiplier 66.

The output of multiplier 60 is $I_k I_{k-1}$, of multiplier 62 is $Q_k Q_{k-1}$, of multiplier 64 is $Q_k I_{k-1}$, and of multiplier 66 is $I_k Q_{k-1}$.

The outputs of multipliers 60 and 62 are summed in summer 72 to produce the real component $\cos(\theta_k - \theta_{k-1})$, while the outputs of multipliers 64 and 66 are summed in summer 74 to produce the imaginary component $\sin(\theta_k - \theta_{k-1})$, where $\theta_K$ is the phase angle of the present sample taken by A/D converter 22 and $\theta_{k-1}$ is the phase angle of the immediately preceding sample. The arctangent of the summed signals produced by summers 72 and 74 is generated by arctangent network 76 to produce $\theta_k - \theta_{k-1}$, which is the difference in phase angle between the preset and immediately preceding samples, and thus representative of the amplitude of the modulating signal. The value thus produced by the arctangent function is equalized by network 78 to produce the output value X.

The demodulation techniques just described can be described in mathematical terms. The FM signal can be described as a function of time (t) in polar coordinates as follows:

$$Y(t) = A(t) E^{j\theta(t)}$$

where:
A = amplitude as a function of time, and
$\theta$ = phase angle.

The original signal which we are now recovering with the invention is mathematically the rate of change, or derivative, of the angle $\theta$.

In rectangular coordinates the FM signal of equation 1 can be expressed as follows:

$$Y(t) = A(t)(\cos \theta(t) = j \sin \theta(t)).$$

Resolving this into its quadrature components, then $$I(t) = ReY = A(t)\cos \theta(t)$$

and $$Q(t) = IM(Y)(t) = A \sin \theta(t).$$

If we let X(t) be the modulating signal that determines $\theta(t)$, then $$\theta(t) = \omega_c t + 2\pi f_d \int^t X(\tau) d\tau$$

where
$f_d$ indicates the peak frequency deviation,
$\omega_c$ indicates the carrier frequency offset from the IF frequency, and and
$\omega_d = 2\pi f_d$
$\theta(t) = \omega_c + \omega_d x(t)$ where $\omega c = 0$ if no offset.

This implies that the derivative of $\theta(t)$ must be obtained to recover the modulation. Differentiation is approximated by slope of differences, i.e., angle change $\Delta\theta(t)$, over a short period of time.

Thus, sampling Y and resolving it into components gives samples of Y in rectangular coordinates in the forms:

$$I_k = A_k \cos \theta_k, \text{ and}$$

$$Q_k = A_k \sin \theta_k.$$

Using the polar form of Y, $\Delta\theta(t)$ may be obtained by multiplying the complex conjugates:

$$Y \cdot Y^* = A^2 e^{j\theta(t)} e^{-j[\theta(t-t_1)]} = A^2 e^{j[\theta(t)-\theta(t-t_1)]}$$

where $\theta(t) - \theta(t-t_1) = \Delta\theta$.

Using the sampled data represented by I and Q in rectangular coordinates:

$Y_k Y_{k-1}^* = (I_k + jQ_k) \cdot (I_{k-1} - jQ_{k-1}) =$
$(I_k I_{k-1} + Q_k Q_{k-1}) + j(Q_k I_{k-1} - I_k Q_{k-1})$
since
$Y_k = A_k e^{j\theta_k}$ and $Y_{k-1}^* = A_{k-1} e^{-j\theta_{k-1}}$
then by Euler's rule
$Y_k \cdot Y_{k-1}^* = A_k A_{k-1} e^{j(\theta_k - \theta_{k-1})} =$
$A_k A_{k-1}[\cos(\theta_k - \theta_{k-1}) - j\sin(\theta_k - \theta_{k-1})]$.
By association then,
$RE = \cos(\theta_k - \theta_{k-1}) = (I_k I_{k-1} + Q_k Q_{k-1})$
$IM = \sin(\theta_k - \theta_{k-1}) = (Q_k I_{k-1} - I_k Q_{k-1})$ and
$\Delta\theta_k = \theta_k - \theta_{k-1} = \tan^{-1}[IM/RE]$ $$IM/RE = \frac{Q_k I_{k-1} - I_k Q_{k-1}}{I_k I_{k-1} + Q_k Q_{k-1}}$$

The ratio computation removes the amplitude dependencies without the necessity for a limiter ahead of the discriminator. Practical computation accuracy may optionally be improved powers by of two scaling on I and Q sample pairs to place them in the magnitude range:

$$0.5 \leq \max(I, Q) < 1$$

This is an approximate form of limiting which the discriminator of the present invention will allow whereas many previous discriminators will not. The quotient and the arctangent calculation may be approximated by using a lookup table, and the angle quadrant is determined by the signs of I and Q. Depending upon the signs of I and Q, $\theta$ is used as is or negated, or negated and added to $\pi$ or reduced by $\pi$.

The equalization filter filters the angle difference $\Delta\theta$ to correct its frequency response and to form the estimate of the derivative.

The invention provides demodulation of FM signals with no inherent distortion even when operated at the lowest possible sample rate which will support the available bandwidth, since the algorithm calculates the exact value of angle change and this differs from a sample of the true angle derivative only by a frequency response rolloff which can be easily compensated. Further, for a given practical distortion level the invention permits a less accurate arctangent calculation to be used than if $\theta$ were found and differentiated.

While a particular embodiment of the present invention has been shown and described, it should be obvious that minor changes and modifications may be made therein without departing from the true scope and spirit of the invention. It is the intention in the appended claims to cover all such changes and modifications.

What is claimed is:

1. A demodulator for an analog FM modulated signal, comprising:
   means for continuously converting the FM signal to a time series of digital values at a predetermined sampling frequency;
   means for producing the base band quadrature component values of said signal;
   means for delaying the values of said quadrature components for a predetermined time;
   means for producing a value representing the complex cross-product of said quadrature components and the delayed values of said quadrature components; and
   means for producing the arctangent of said cross-product value.

2. A demodulator for an analog FM modulated signal in accordance with claim 1 wherein said predetermined delay in said delaying means in one cycle of said converting means at said sampling frequency.

3. A demodulator for an analog FM modulated signal in accordance with claim 2 further including means for frequency equalizing the arctangent of said cross-product.

4. A demodulator for FM modulated radio frequency signals, comprising:
   means for down-converting said radio frequency signal to an intermediate frequency signal;
   means for producing first base band quadrature components of said intermediate frequency signal at a first time;
   means for producing second base band quadrature components of said intermediate frequency signal at a second time;
   means for producing the complex cross-product of said first and second quadrature components; and
   means for producing the arctangent of said cross-product.

5. A demodulator for FM modulated radio frequency signals in accordance with claim 4 further including means for converting said intermediate frequency signal to a time series of digital values at a predetermined sampling rate.

6. A demodulator for FM modulated radio frequency signals in accordance with claim 5 wherein said first and second times are separated by one cycle of said digital converting means.

7. A demodulator for FM modulated radio frequency signals in accordance with claim 6 wherein means for producing second base band quadrature components of said intermediate frequency signal at a second time comprises means for delaying said signal for one cycle of said digital converting means.

8. A demodulator for FM modulated radio frequency signals in accordance with claim 7 further including means for frequency equalizing the arctangent of said cross-product.

9. A method of demodulating an FM modulated radio frequency signal, comprising the steps of:
   down-converting the signal to an intermediate frequency;
   sampling the value of said intermediate frequency signal at a predetermined frequency to produce a time series of values;
   converting the sampled values to binary values;
   down-converting the binary values of said signal to base band frequency binary values representative of the quadrature components of said signal;
   delaying the base band digital values for a predetermined time;
   calculating the complex cross-product of each binary value of said quadrature components and each delayed binary value of said quadrature component; and calculating the arctangent of each said complex cross-product to produce a time series of values of the demodulated signal.

10. A method of demodulating an FM modulated radio frequency signal in accordance with claim 9 wherein said predetermined time in said delaying step is one cycle at sampling frequency.

11. A method of demodulating an FM modulated signal, comprising the steps of:
producing base band signals representative of the quadrature components $I_k$ and $Q_k$ of said signal;
delaying said base band signals for a predetermined interval to produce delayed quadrature components $I_{k-1}$ and $Q_{k-1}$;
calculating complex cross-products related to said signals $I_k Q_k$, $I_{k-1}$ and $q_{k-1}$; and
calculating an arctangent related to said complex cross-products to produce a signal representative of the demodulated signal.

12. A method of demodulating an FM modulated signal in accordance with claim 11, wherein said producing step provides a time series of binary values at a output sampling frequency.

13. A method of demodulating an FM modulated signal in accordance with claim 12 wherein said delaying step delays said base band signals one cycle at said sample frequency.

14. A method of demodulating an FM modulated signal in accordance with claim 13 further including the step of converting the signal representative of the demodulated signal to analog form for reproduction, if said demodulated signal contains analog information.

15. A demodulator for an analog FM modulated signal, comprising:
means for continuously converting the FM signal to a time series digital value at a predetermined sampling frequency;
means for producing the base band real quadrature component values $I_k$ and imaginary quadrature component value $Q_k$ of said signal;
means for producing the base band real value $I_{k-1}$ and base band imaginary value $Q_{k-1}$ of said quadrature components delayed by one cycle at said sampling frequency for a predetermined time;
first means for multiplying said $I_k$ value by said $I_{k-1}$ value;
second means for multiplying said $Q_k$ value by said $Q_{k-1}$ value;
third means for multiplying said $Q_k$ value by said $I_{k-1}$ value;
fourth means for multiplying said $I_k$ value by said $Q_{k-1}$ value;
first means for summing the results from said first and second multiplying means;
second means for summing the results from said third and fourth multiplying means;
means for deriving the ratio of the results of said first and second summing means; and
means for equalizing the output from said deriving means.

* * * * *